United States Patent [19]
Masami

[11] Patent Number: 5,518,410
[45] Date of Patent: May 21, 1996

[54] CONTACT PIN DEVICE FOR IC SOCKETS

[75] Inventor: Fukunaga Masami, Kawaguchi, Japan

[73] Assignee: Enplas Corporation, Japan

[21] Appl. No.: 247,668

[22] Filed: May 23, 1994

[30] Foreign Application Priority Data

May 24, 1993 [JP] Japan .................. 5-027068 U
Mar. 31, 1994 [JP] Japan .................. 6-063156

[51] Int. Cl.$^6$ ........................... H01R 23/72
[52] U.S. Cl. ................. 439/71; 324/761; 439/73; 439/700
[58] Field of Search ............... 439/68–73, 525, 439/526, 482, 700, 824; 324/758, 761

[56] References Cited

U.S. PATENT DOCUMENTS

| | | | |
|---|---|---|---|
| 4,061,969 | 12/1977 | Dean | 324/761 |
| 5,032,787 | 7/1991 | Johnston et al. | 439/482 |
| 5,106,309 | 4/1992 | Matsuoka et al. | 439/70 |
| 5,419,710 | 5/1995 | Pfaff | 439/71 |

FOREIGN PATENT DOCUMENTS 58-180953  10/1983  Japan ........................ 439/482

Primary Examiner—Neil Abrams
Attorney, Agent, or Firm—Graham & James

[57] ABSTRACT

A contact pin device for IC sockets includes a socket body having a plurality of contact pins; a floating plate which is sustained above socket body, always urged upward, and has contact receivers formed therein for receiving the contact pins; and a pressing member which is mounted on the floating plate and is used to press down a BGA type IC package having a plurality of downward protruding spherical connecting terminals. The floating plate allows the spherical connecting terminals of the IC package to be brought into contact with the contact pins in the contact receivers thereof. Further, the top ends of the contact pins are provided with contact sections for receiving and electrically connecting lower spherical sections other than spherical tips of the spherical connecting terminals. The contact pin device for IC sockets has a relatively simple configuration, but assures secure electrical connection between the connecting terminals and the contact members. Additionally, the rotations of the contact sections in a condition where the contact sections are urged against and brought into contact with the spherical connecting terminals prevent an electrical connection failure attributable to dust and oxides. This provision is also applicable to IC sockets for IC package of gull-wing, LGA, and LCC types.

12 Claims, 10 Drawing Sheets

FIG. 14
FIG. 15
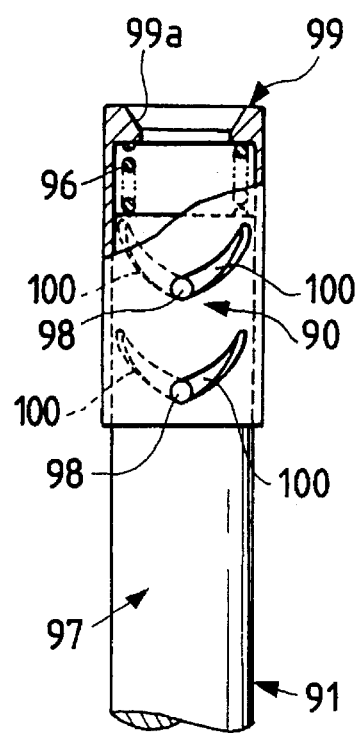
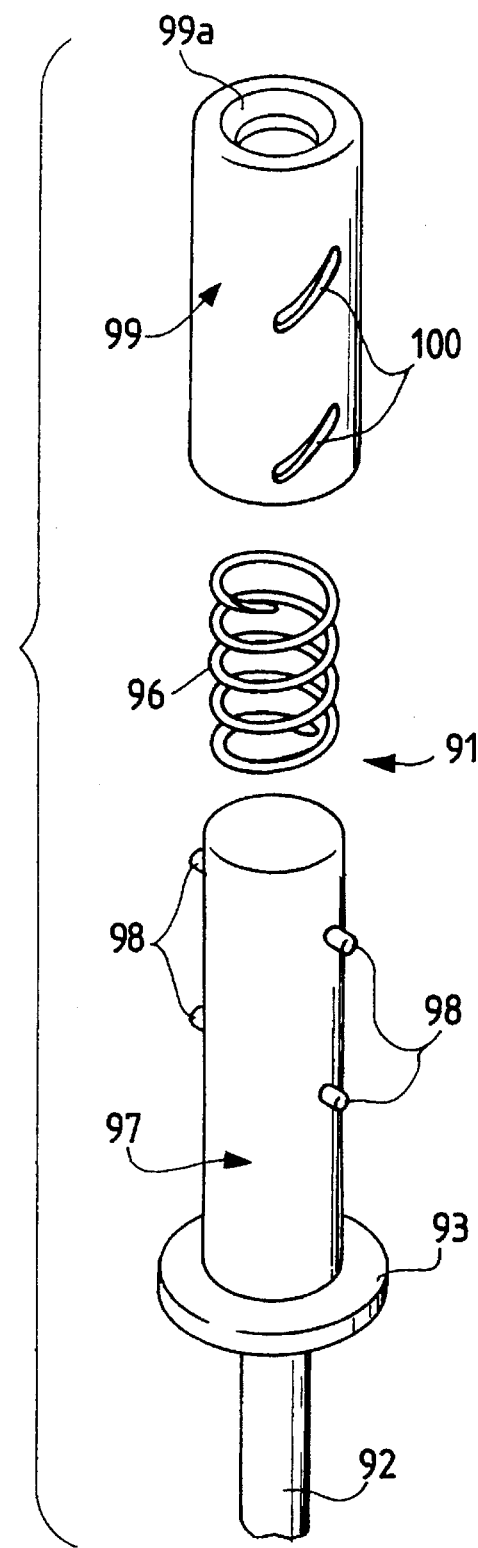

FIG. 20
FIG. 21
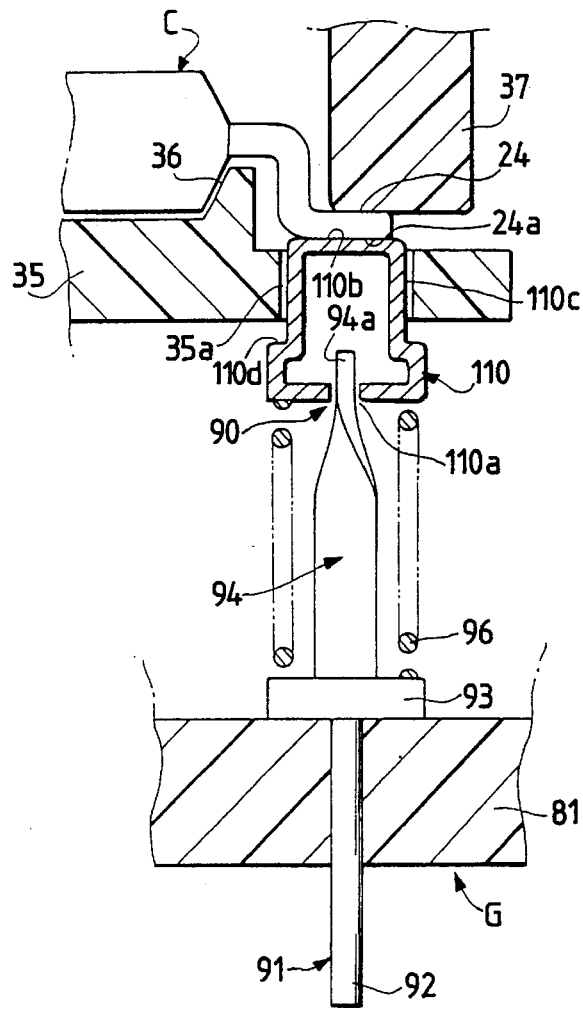
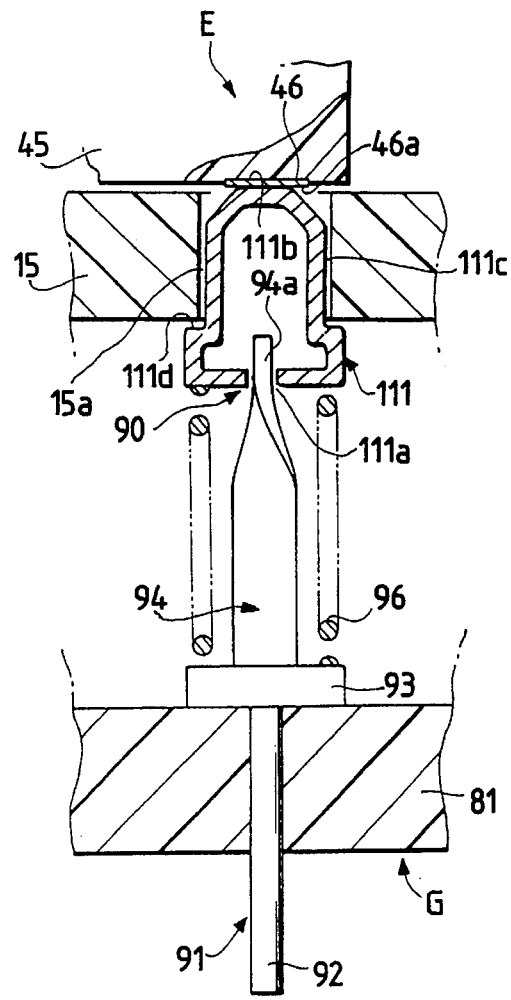

CONTACT PIN DEVICE FOR IC SOCKETS

BACKGROUND OF THE INVENTION a) Field of the Invention

The present invention relates to a contact pin device for IC sockets and, more specifically, to a contact pin device which is to be used in an IC socket for electric transmission tests of an IC package having a plurality of connecting terminals on the package body and serves for connecting the IC socket to the connecting terminals.

b) Description of the Prior Art

IC sockets of this type are generally used for electrically connecting IC packages to external circuits, in particular, for carrying out various kinds of electric transmission tests of semiconductor integrated circuits built in the IC packages. Most of these IC sockets have connecting pins configured so as to correspond to the connecting terminals of various types of IC packages, for example, a BGA (Ball Grid Array) type IC package having nearly spherical connecting terminals, flat type IC package having gull-wing type connecting terminals (hereinafter referred to as gull-wing type), LGA (Land Grid Array) type IC package having pad-like connecting terminals, and LCC (Leadless Chip Carrier) type IC package.

Of the IC packages mentioned above, the BGA type IC package consists of a package body incorporating required circuits, and a large number of connecting terminals which are made of a solder material and arranged on a bottom surface of the package body in a matrix pattern spherically protruding for connection to external circuits. For electrically connecting the BGA type IC package to a printed circuit board, the package body is mounted at a predetermined location of the printed circuit board and the connecting terminals are connected directly to corresponding circuit terminals by partially melting the solder material of the connecting terminals.

Since the BGA type IC package has the connecting terminals which are to be soldered directly to the circuit terminals of the printed circuit board, this package may have gaps between the tips of the spherical connecting terminals and the circuit terminals after the package body is mounted at the predetermined location of the printed circuit board, thereby disabling soldering connection from making good electrical contact and constituting hindrance in practical works, in case where the tips of all the connecting terminals do not protrude downward in alignment, i.e., in case where the connecting terminals have protruding lengths which are different, though slightly, due to injury or breakage of any of the spherical tips.

The BGA type IC package, as well as the other types of IC packages, is subjected to various performance evaluation tests including a heat test referred to as burn-in test while electrically energizing all of the connecting terminals to thereby check whether or not the circuits operate as specified after manufacturing or before shipping. The IC socket is used for performing the performance evaluation tests of the IC package.

In FIGS. 1 and 2, a BGA type IC package A is composed of a package body 1 having required circuitry built therein, and a large number of connecting terminals 2 which are made of a solder material, protrude nearly spherically from a bottom surface 1a of the package body 1 and are arranged in a matrix pattern.

On the other hand, an IC socket B for the electric transmission tests of the IC package A consists of a socket body 11 having a concavity 12 formed at a predetermined location on a top surface of the socket body 11. Disposed in the concavity 12 is a floating plate 15 which is movably guided by guide pins 13 and always urged upward by springs 14.

Further, the floating plate 15 is formed with a positioning concavity 16 for receiving a lower section of the package body 1 while restricting a position thereof. Bored in the positioning concavity 16 are, at locations corresponding to the connecting terminals 2 of the package body 1, contact pin receivers 17 each of which has a tapered reception guide 17a as an upper half thereof and a space 17b as a lower half thereof.

Studded in the concavity 12 of the socket body 11, at locations corresponding to the contact pin receivers 17, are contact pins 21 which have contacts 21a having slightly larger diameters on their tops and are flexed in the spaces 17b so as to have required resilience. The contact pins 21 are inserted into the contact pin receivers 17 through the spaces 17b and kept in a condition where the contacts 21a protrude into the reception guides 17a by a required distance.

Though not illustrated in detail in FIGS. 1 and 2, the socket body 11 is provided with a cover pressing plate 18 which is hinged at one end thereof so that it can be opened and closed as desired, and can be sustained in an adequately latched condition at the other end to press down the package body 1 as uniformly as possible.

For testing the conventional IC package A by using the IC socket B, the lower section of the package body 1 is set and temporarily positioned in the positioning concavity 16 of the floating plate 15 by holding the cover pressing plate 18 open with respect to the socket body 11 and then the cover pressing plate 18 is kept in an adequately closed condition.

By the procedures described above, the floating plate 15 is pressed downward, against the resilience of the springs 14, under a pressure applied to the package body 1 by the cover pressing plate 18 and the contacts 21a of the contact pins 21 are brought into contact with the corresponding connecting terminals 2. In this condition, the contact pins 21 are flexed in the spaces 17b, as indicated by the dashed lines in FIG. 2, against the resilience of themselves, thereby producing the required contact pressure. The IC package A is thus set on the IC socket B as a preparation for performing the performance evaluation tests of the IC package A.

In the case of an ordinary IC socket of this type, however, good electrical connection may not be established between the contacts 21a of the contact pins 21 and the connecting terminals 2 since the IC socket cannot remove films of oxide or dust and foreign matters which are deposited on the surfaces of the contacts 21a and/or the connecting terminals 2 and hinder good electrical connection.

The IC socket B which is shown in FIGS. 1 and 2, by contrast, is configured so that strong resilience is imparted to the contact pins 21 and the contacts 21a of the contact pins 21 strongly press the surfaces of the connecting terminals 2, thereby breaking the films of oxide or pushing away the dust and foreign matters for establishing electrical connection securely.

In addition to the IC socket B described above which is configured so as to press the contacts 21a of the contact pins 21 strongly to the connecting terminals 2, there has been proposed another type of IC socket, for use with IC packages having the so-called gull-wing type connecting terminals, which is configured so as to establish secure electrical connection by strongly rubbing or wiping surfaces of the connecting terminals with contacts. A configuration of this IC socket is schematically shown in FIG. 3.

In FIG. 3, an IC package C has gull-wing type connecting terminals 24 which extend from both sides of a package body 23 outward and are then bent downward. Further, an IC socket D for electric transmission tests of the IC package C has a socket body 31 which has a concavity 32 formed at a predetermined location of a top surface thereof. Disposed in the concavity 32 is a floating plate 35 which is vertically guided by guide pin 33 and always urged upward by springs 34. Studded on edges of opposite sides of the concavity 32 of the socket body 31 are contact pins 41 which have tops configured as contacts 42 supported by springs 43 having a sideway-laid U-shape.

At a predetermined location of the upper surface of the floating plate 35, a positioning concavity 36 is formed which receives a lower section of the package body 23 of the IC package C having the connecting terminals 24 while restricting the position of the package body 23. The positioning concavity 36 is designed so that the connecting terminals 24 correspond to the contacts 42 of the contact pins 41 when the package body 23 is set in the positioning concavity 36. Further, the socket body 31 is provided with a cover pressing plate 37 which is to be used for pressing the package body 23 from upside as uniformly as possible and can be latched in a pressing condition thereof.

For mounting the IC package C having the conventional gull-wing type connecting terminals on the IC socket D, a lower section of the package body 23 is set and positioned in the positioning concavity 36 of the floating plate 35 with the cover pressing plate 37 open on the socket body 31, and then the cover pressing plate 37 is set an adequately closed condition. By the procedures described above, the connecting terminals 24 are brought into pressurized contact with the contacts 42 of the contact pins 41 under the pressure applied from the cover pressing plate 37 to the connecting terminals 24.

Since the springs 43 having the sideway-laid U-shape are pressed and urged in the process to bring the connecting terminals 24 into the pressurized contact with the contacts 42, contact surfaces of the connecting terminals 24 are rubbed or wiped with the contacts 42, whereby the films of oxide or dust and foreign matters are broken or removed for establishing secure electrical connection under a required contact pressure. After the IC package C has been set on the IC socket D, performance evaluation tests of the IC package C can be carried out as scheduled.

The wiping function obtained between the connecting terminals 24 and the contacts 42 is easily applicable, with the similar effect, also to an IC package E which, as shown in FIG. 4, has pad-like connecting terminals 46 located nearly flush with a bottom surface of an IC package body 45, through it is necessary to modify the shape of the contact pins shown in FIG. 3 so as to match with the pad-like connecting terminals 46.

However, the conventional IC socket B described above is disadvantageous in that it allows the surfaces of the connecting terminals 2 to be sunk or injured, thereby lowering a commercial value of the IC package when the surfaces of the connecting terminals 2 are strongly pressed by the contacts 21a of the contact pins 21.

When the burn-in test is effected for checking heat resistance of an IC package having the connecting terminals made of a solder material or the so-called solder balls in a condition where the connecting terminals 2 are connected to the contact pins 21, the solder material may be slightly softened by heat, whereby portions pressed by the contacts 21a are deformed and the deformed portions are hardened as they are after completing the performance evaluation tests. When the connecting terminals 2 are the solder balls as described above, marginal portions of the solder balls are brought into close contact with circuit terminals of a printed circuit board and partially melted for soldering the connecting terminals 2 to the circuit terminals. At this soldering stage, the deformed and hardened portions may be hardly melted. Similar defects may be produced when the connecting terminals 2 are not the solder balls, but made of a material having a relatively low melting point such as lead, zinc, aluminium, gold or silver. When the connecting terminals 2 have lower sections which are deformed or injured as described above, it is impossible to establish secure electrical connection between the connecting terminals and the circuit terminals of an IC package, in particular the BGA type IC package, at a stage in which the IC package is mounted on a printed circuit board.

Also in the case of the IC package C having the conventional gull-wing type connecting terminals or the IC package E having the pad-like connecting terminals, an area to be wiped with the contact of the contact pin is determined uniquely depending on an area of the connecting terminal to be brought into contact with the contact of the contact pin since the contact of the contact pin is urged linearly by a spring. As a result, the films of oxide may not be broken or dust may not be removed completely when a relatively narrow area of the connecting terminal is brought into contact with the contact, and the connecting terminal itself may be deformed in the case of the gull-wing type connecting terminal.

Even in a case where a relatively wide area of the connecting terminal is brought into contact with the contact of a contact pin 41, such as that shown in FIG. 3, a moving distance of the contact 42 is determined depending on a size of the spring 43. Accordingly, a similar problem is posed when the contact pin 41 has a relatively small spring 43 having the sideway-laid U-shape. An attempt which is made to enlarge the spring 43 will make it necessary to widen the socket body 31 on which the contact pins 41 are studded and such widening of the socket body 31 will reduce a number of IC sockets which can be mounted on a single printed circuit board to be tested, thereby resulting in lowering efficiencies in tests of IC packages.

SUMMARY OF THE INVENTION

It is, therefore, an object of the present invention to provide a contact pin device for IC sockets which is free from a fear to injure or break contact surfaces of connecting terminals of IC packages.

According to one aspect of the present invention, the contact pin device for IC sockets has contact holes or contact concavities formed in contacts of contact pins of an IC socket, and lower sections other than spherical tips of spherical connecting terminals protruding downward from the BGA type IC package, namely spherical circumferences of the spherical connecting terminals, are brought into contact with the contact holes or the contact concavities.

Specifically, the contact pin device for IC sockets according to the present invention comprises, at least, a socket body having a plurality of contact pins; a floating plate which is movably sustained above the socket body, always urged upward and has contact receivers formed therein; and a pressing member for pressing downward a BGA type IC socket mounted on the floating plate. In the contact receivers formed in the floating plate, the connecting terminals protruding downward from the BGA type IC package are brought into contact with the contact pins. Further, the top ends of the contact pins are formed with contacts which are to receive lower spherical circumferential sections other than spherical tips of the spherical connecting terminals for establishing electrical connection. Accordingly, the contact pin device for IC sockets according to the present invention eliminates a fear that the tips of the spherical connecting terminals may be damaged or broken at a stage in which the connecting terminals are soldered to circuit terminals by partial melt for connecting the IC package to a printed circuit board.

Further, the floating plate are provided with positioning pieces for positioning a package body of the BGA type IC package, and a clearance between a positioning surface of each positioning piece and the package body is made smaller than a value obtained by subtracting a positional deviation between the contact receiver and the spherical connecting terminal from a difference in size between the contact receiver and the spherical connecting terminal. When the package body is mounted and positioned on the floating plate, the connecting terminals are securely brought into contact with the contacts formed in the top ends of the contact pins.

According to another aspect of the present invention, the contact pin device for IC sockets is constructed so that the contacts can move with rotation when the contacts are pressed for longitudinal movement.

That is to say, the present invention provides a contact pin device for IC sockets which is to be used for establishing electrical connection between an IC package and external circuits and has movable contact pins which are to be brought into pressurized contact with the connecting terminals of the IC package for establishing the required electrical conduction. The movable contact pins are such that contact members which are to be brought into contact with the connecting terminals are rotatable in a condition where they are kept in pressurized contact with the connecting terminals. In the contact pin device for IC sockets according to the present invention, the contact members which are to be brought into contact with the connecting terminals are disposed separately from other members so as to operate in a condition where they are urged in a contacting direction relative to the other members, and a sliding-rotation converter mechanism is disposed between these two kinds of members so that contact members are rotatable in the pressurized contact condition when the contact members are brought into the pressurized contact with the connecting terminals.

Accordingly, the contact members are slid and rotated without changing contacting locations thereof in the condition where they are kept in the pressurized contact with the connecting members for obtaining a required wiping effect by the sliding rotation, thereby establishing effective and secure electrical connection between the connecting terminals and the contact members when the contact members are brought into the pressurized contact with the connecting terminals of the IC socket.

This and other objects as well as the features and advantages of the present invention will become apparent from the following detailed description of the preferred embodiments when taken in conjunction with the accompanying drawings.

BRIEF DESCRIPTION OF THE DRAWINGS

FIG. 14 is a front view schematically showing the main members, partially cut away, of a contact pin device preferred as a third embodiment of the present invention;

FIG. 15 is an exploded view illustrating the contact pin device in the third embodiment;

FIGS. 8A, 8B and 8C are diagrams descriptive of sequential steps of a sliding rotational motion of the fourth embodiment;

FIG. 20 is a longitudinal sectional view showing, on an enlarged scale, main members of a contact pin device preferred as a sixth embodiment in a condition where a connecting terminal of the gull-wing type IC package is connected under pressure to the contact pin device; and FIG. 21 is a longitudinal sectional view illustrating, on an enlarged scale, main members of a contact pin device preferred as a seventh embodiment of the present invention in a condition where a connecting terminal of an IC package having pad-like terminals is connected under pressure to the contact pin device.

DETAILED DESCRIPTION OF THE PREFERRED EMBODIMENTS

Now, with reference to the preferred embodiments illustrated in the accompanying drawings, the present invention will be described in detail below.

First Embodiment

Figure 1:
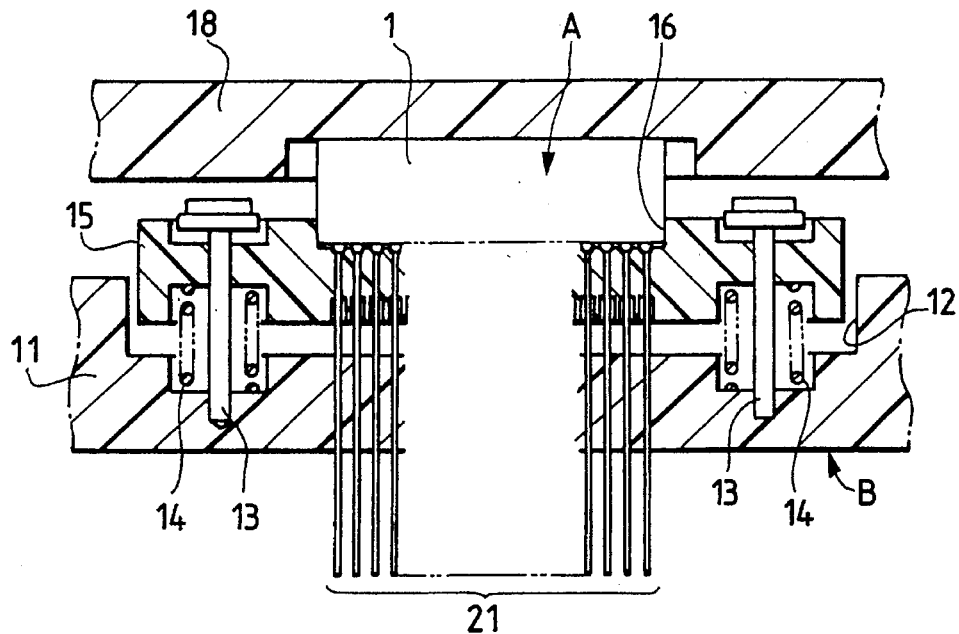
FIG. 1 is a longitudinal sectional view illustrating a configuration of main members of a conventional IC socket used for connecting a BGA type IC package.
Figure 2:
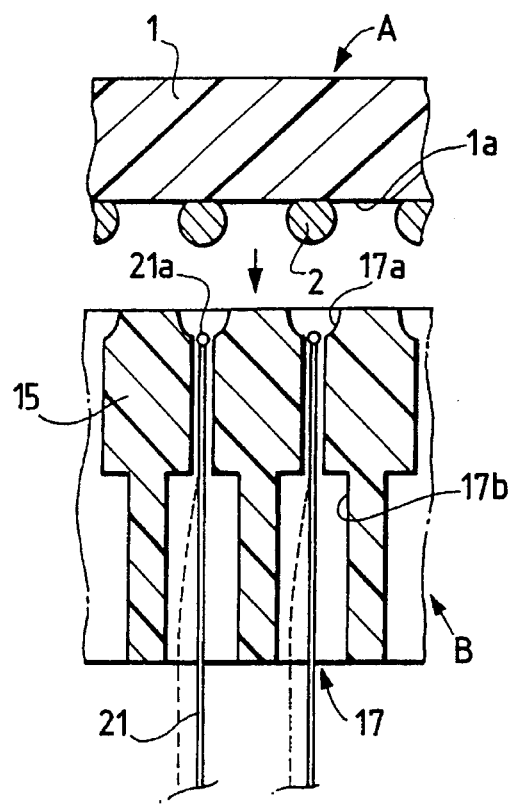
FIG. 2 is a partial longitudinal sectional view schematically showing details of the configuration of the IC socket illustrated in FIG. 1.
Figure 3:
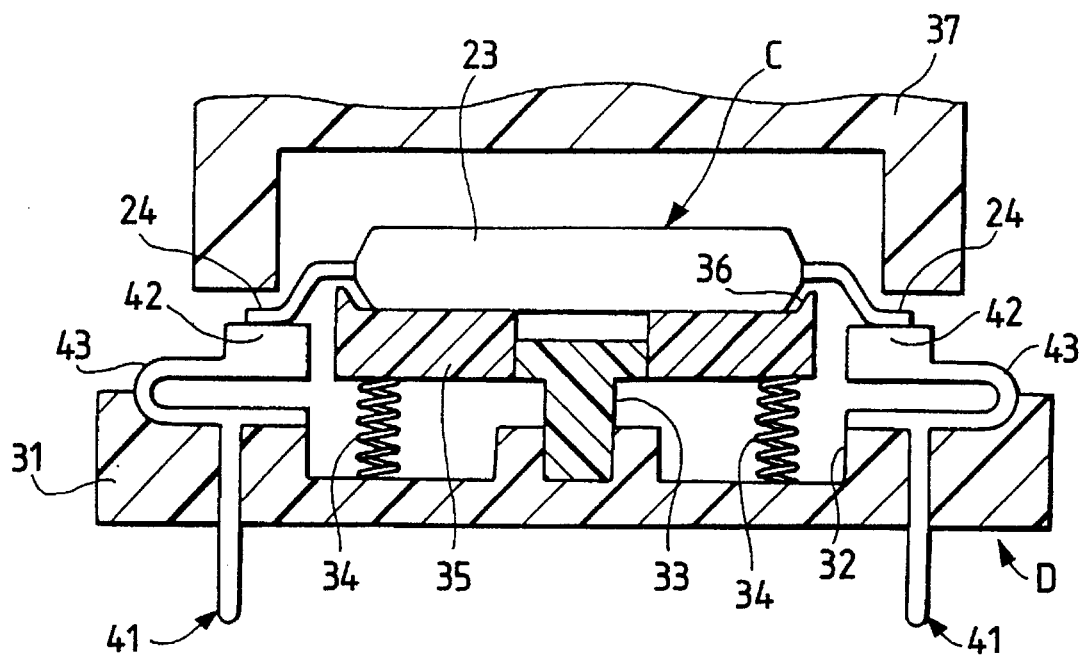
FIG. 3 is a longitudinal sectional view schematically showing a configuration of main members of a conventional IC socket used for a gull-wing type IC package.
Figure 4:
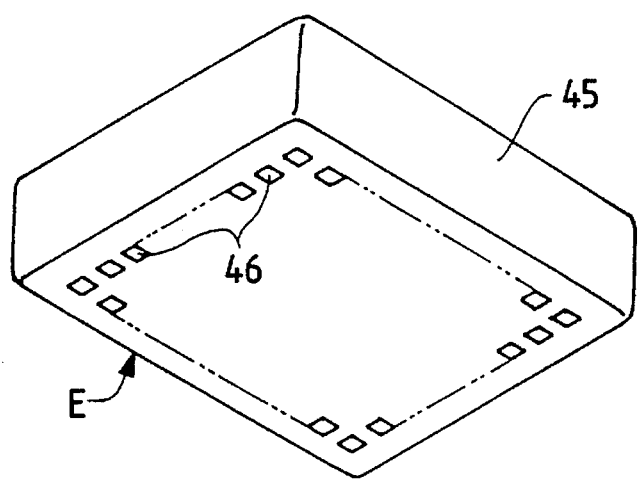
FIG. 4 is a perspective view schematically showing an appearance of a conventional IC package having pad-like connecting terminals.
Figure 5A:
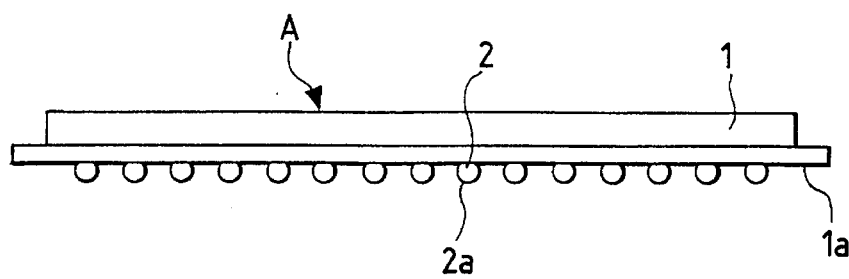
FIGS. 5A and 5B are a side view illustrating a fundamental configuration of the BGA type IC package having spherical connecting terminals for which the contact pin device according to the present invention is to be used and an enlarged view illustrating the spherical connecting terminals, respectively.
Figure 5B:
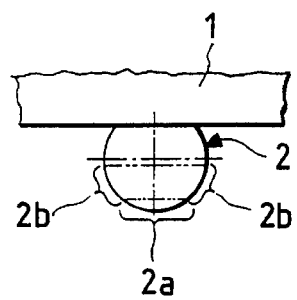

The first embodiment of the present invention, as shown in FIGS. 5A and 5B, is applied to a BGA type IC package A having a large number of spherical connecting terminals 2 which are made of a solder material, configured in a nearly spherical form having spherical tips 2a protruding downward and arranged in a matrix pattern on a bottom surface 1a of a package body 1. The IC package is connected to a printed circuit board by mounting the package body 1 at a predetermined location of the printed circuit board and partially melting the solder of the lower ends, i.e., protruding spherical tips 2a, of the spherical connecting terminals 2 so that they are soldered directly to corresponding circuit terminals.

The first embodiment of the present invention is such that, like the conventional contact pin device, the spherical connecting terminal 2 is soldered to corresponding circuit terminals by partially melting the solder of the lower ends 2a of the spherical connecting terminals 2 after the package body 1 is mounted at the predetermined location of the printed circuit board.

According to the present invention, the spherical connecting terminals 2 are partially utilized as described below. The spherical tips 2a which are partially melted for connection to the printed circuit board are not used as connectors for performance evaluation test, but circumferential portions 2b which range from spherical circumferential portions having a sectional diameter a little smaller than the sectional diameter indicated by a centerline, as shown in FIG. 5B, to spherical circumferential portions having a predetermined sectional diameter of the spherical tips 2a are used as connectors in place of the spherical tips.

In FIGS. 6 through 9, an IC socket F for testing the BGA type IC package A shown in FIG. 5A is formed with a concavity 52 in a top surface of a socket body 51, in which a spring 54 is provided so that one end is held to a protrusion 53a formed in the concavity 52 and the other end is held to a protrusion 53b formed on a bottom surface of a floating plate 61. The spring 54 always urges the floating plate 61 upward relative to the socket body 51.

The floating plate 61 is constructed integral with a plurality of positioning pieces 62 at predetermined circumferential locations on a top surface thereof, at four corners in this case, for receiving and positioning the bottom surface 1a of the package body 1. The floating plate 61 is provided with a plate which has positioning surface 62a located on a lower sections of opposed inside walls (parallel and perpendicular to the plane of the paper in FIGS. 6 and 7) of the positioning pieces 62 and outward spread guide surfaces 62b located on upper sections of the inside walls, there positioning pieces 62 being provided at four corners thereof. This plate, as shown in FIG. 8, has contact receivers 63 bored for receiving main contact portions 75 of contact pins 71 at locations corresponding to the spherical connecting terminals 2 of the package body 1.

Figure 6:
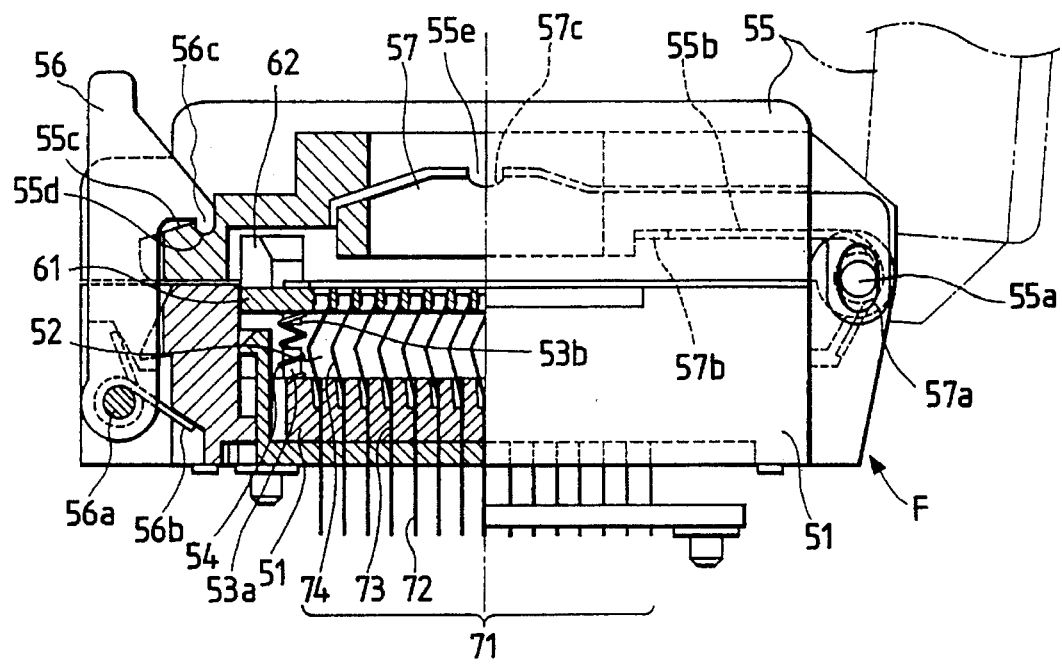
FIG. 6 is a front view including a partial sectional view schematically showing a configuration of an IC socket for the BGA type IC package using a contact pin device preferred as a first embodiment of the present invention.
Figure 7:
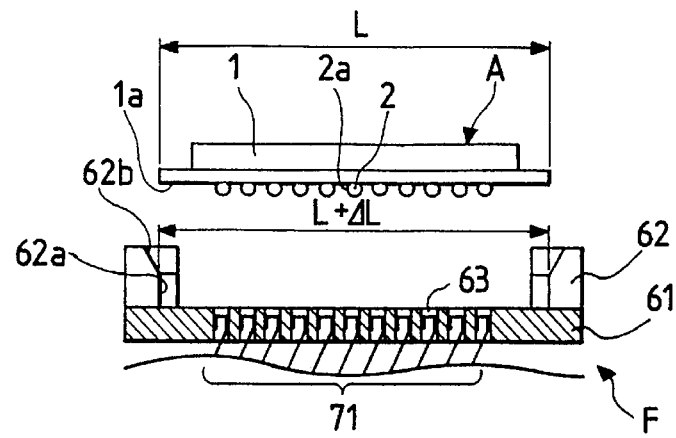
FIG. 7 is a sectional view showing the relationship between the IC socket used in the first embodiment and the BGA type IC package.
Figure 8:
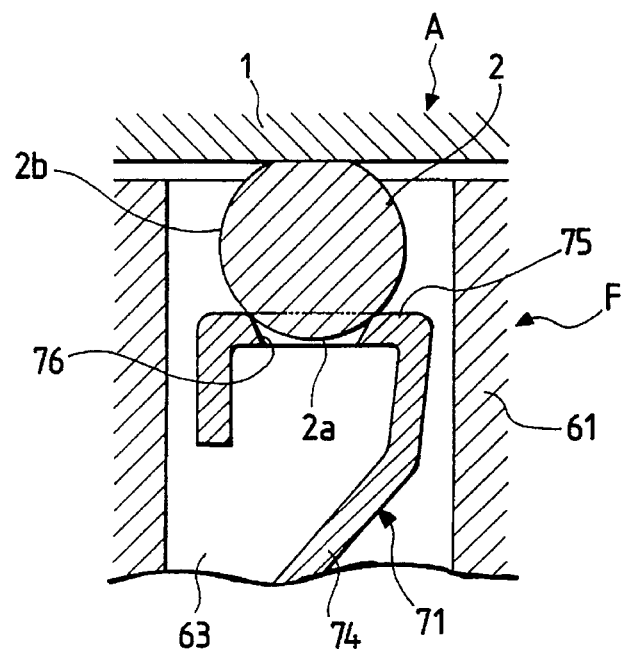
FIG. 8 is a partial sectional view illustrating a condition where the contact pin of the IC socket used in the first embodiment is set in a pressurized connection with the connecting terminal of the BGA type IC package.

The bottom surface 1a has a longitudinal length L (size in the direction parallel with the plane of the paper in FIG. 7) and a width W in the direction perpendicular to the longitudinal direction (size in the direction perpendicular to the plane of the paper but not shown in FIG. 7). The positioning surfaces 62a are disposed with spacings which are a little longer than the length L and the width W of the bottom surface 1a of the package body 1, namely with a spacing L+ΔL in the longitudinal direction (size in the direction parallel to the plane of the paper in FIGS. 6 and 7) and with a spacing W+ΔW in the direction perpendicular to the longitudinal direction (size in the direction perpendicular to the plane of the paper in FIGS. 6 and 7 but not shown). For clearances between the length L of the bottom surface 1a and the longitudinal spacing L+ΔL of the positioning surfaces 62a, and between the width W of the bottom surface 1a and the spacing W+ΔW (corresponding to ΔL and ΔW, respectively), each should be set at a value smaller than that obtained by subtracting, from the difference between the inside diameter of each contact receiver 63 of the floating plate 61 and the diameter of the spherical connecting terminal 2, positional deviations caused by manufacture from design locations of the contact receiver 63 and the spherical connecting terminal 2. Accordingly, where the BGA type IC package A is mounted on the floating plate 61, the package body 1 is guided by the guide surfaces 62b formed on the upper sections of the positioning pieces 62 and then positionally restricted by the positioning surfaces 62a. Since in this case the connecting terminals 2 are inserted into the corresponding contact receivers 63 without contacting the floating plate 61, the connecting terminals 2 cannot be damaged by contact or friction.

Each of the contact pins 71 is made of an elastic thin metal sheet which has high electrical conductivity, and formed so as to have a takeout terminal section 72 located on the side of the base plate, a fixed section 73, an intermediate flexible section 74 which is partially bent in the horizontal direction to bring effective resilience, and a central contact main section 75 bent in a lateral direction on its tip side, namely in a horizontal direction parallel to the bottom surface 1a of the package body 1 to be mounted, and having a tapered contact hole 76 formed to have an inside diameter, at an upper edge thereof, smaller than the diameter of the spherical connecting terminal 2 and larger than the maximum diameter of the spherical tip 2a.

On the other hand, the fixed section 73 of the contact pin 71 is studded at a location corresponding to the contact receiver 63 in the concavity 52 of the socket body 51 and the contact main section 75 is inserted and kept in the contact receiver 63 in a condition where the intermediate flexible section 74 is set in the concavity 52. Each of the contact pins 71 designed as described above is received into the contact receiver 63 and easily establishes electrical contact between the inside surface of the tapered contact hole 76 and the spherical circumferential section 2b of the spherical connecting terminal 2, or the required electrical connection, by utilizing the proper resilience of the contact pin 71 in a condition where the spherical tip 2a to be melted is received in the contact hole 76 but is free from contact.

A pivot pin 55a is attached on the right side of the socket body 51, as shown in FIG. 6, to permit opening and closing a cover plate 55. Around the pivot pin 55a are provided a spring 55b and an elliptic hole 57a of a pressing member 57 such as a pressing plate shown in FIG. 9, and one end of the spring 55b presses an elastically pressing section 57b of the pressing member 57 toward the cover plate 55, thereby bringing an arc-like concavity 57c into pressurized contact with a supporting protrusion 55e of the cover plate 55. Accordingly, the pressing member 57 can swing and the cover plate 55 is always urged in an opening direction thereof. On the left side of the socket body 51, a latch lever 56 is provided which is hinged by a pivot pin 56a and always urged in a direction where it is raised (toward a latching position thereof). The front surface of the cover plate 55 is formed with a latch groove 55d together with a slant guide surface 55c, and the right side of the latch lever 56 is formed with a downward latch jaw 56c for latching the cover plate 55 which is guided by the slant guide surface 55c and set in a closed condition thereof.

In the first embodiment of the present invention, the contact receiver 63 of the floating plate 61 and the contact main section 75 of the contact pin 71 may be rectangular or circular in cross sections thereof. Further, the contact hole 76 formed in the contact main section 75 need not necessarily be tapered but may be straight so far as it satisfies the requirements described above. In any way, it is effective to chamfer the upper edge of the contact hole 76 so as to eliminate the possibility that the spherical circumferential section 2b may be injured by the fitting contact.

In the IC socket F used in the first embodiment of the present invention for testing the BGA type IC package A, the cover plate 55 is set in an opened condition thereof by way of the pressing member 57 upon moving the latch lever 56 of the socket body 51 to an opening position thereof against the resilience of the spring 56b. When the package body 1 is mounted among the positioning pieces 62 on the floating plate 61, the package body 1 is guided by the guide surfaces 62b and falls among the positioning surfaces 62a, whereby the package body 1 is automatically positioned. By pressing the cover plate 55 against the resilience of the spring 55b, the pressing plate 57 which is swingingly sustained under the cover plate 55 uniformly presses the package body 1 positionally restricted among the positioning surfaces 62a. Accordingly, the floating plate 61 is pressed downward against the resilience of the spring 54 until the spherical tips 2a of the spherical connecting terminals 2 of the package body 1 are brought into contact with the contact pins. By engaging the latch groove 55d of the cover plate 55 with the latch jaw 56c of the latch lever 56, mounting of the BGA type IC package A on the IC socket F is completed as a preparation for performing the performance evaluation tests of the BGA type IC package A as desired.

Figure 10:
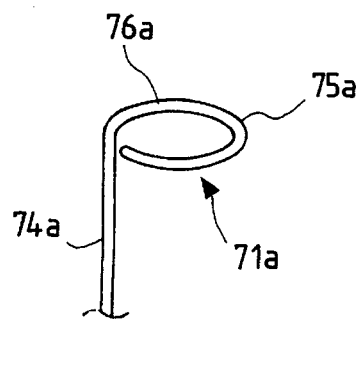
FIGS. 10 and 11 are partial sectional views showing other examples of contact pins to be used with the IC socket in the first embodiment.
Figure 11:
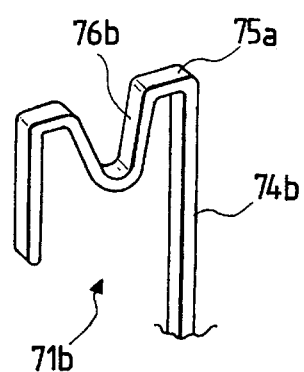

In another example of the contact pin 71 which is illustrated in FIG. 10, the contact pin 71a is made of an elastic metal wire material having a high electrical conductivity and has a circular or nearly circular contact ring 76a, as a section corresponding to the horizontal contact main section 75 formed on the top, which has an inside diameter smaller than the diameter of the spherical connecting terminal 2 and larger than the maximum diameter of the spherical tip 2a. In the case of a contact pin 71b shown in FIG. 11, it is made of an elastic metal wire material having a high electrical conductivity, like that of the contact pin 71a, or of a thin metal plate of a desired width, and has a tapered contact concavity (or contact concavity) 76b, as a section corresponding to the horizontal contact main section 75 formed on the top, which has a diameter at an upper edge thereof smaller than the diameter of the spherical connecting terminal 2 and larger than the maximum diameter of the spherical tip 2a of the connecting terminal 2, and is progressively narrowed downward. The contact pin 71a and the contact pin 71b can provide functions or effects which are the same as, or similar to, those available in the contact pin 71.

Figure 9:
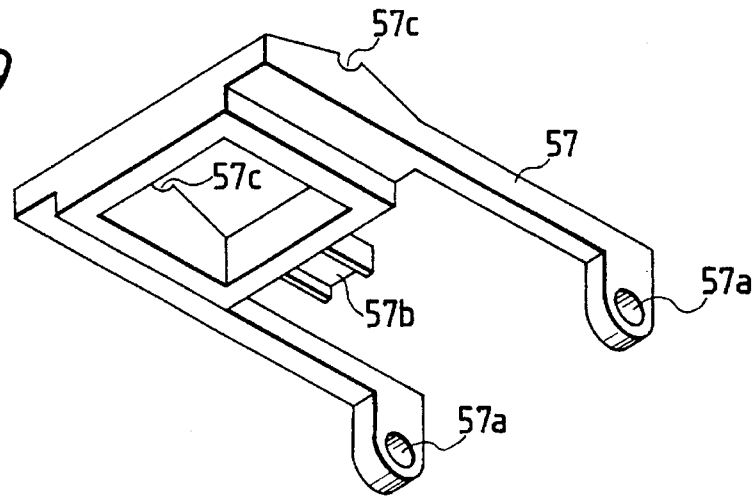
FIG. 9 is a perspective view exemplifying a pressing member for the IC socket used in the first embodiment.

Although in the first embodiment the pressing member 57 shown in FIG. 9 is used for pressing downward the BGA type IC socket A mounted on the floating plate 61, it will be possible in certain cases to use a pressing member made of an elastic pad or spring material or an inelastic material which is integrated with the cover plate 55 and cannot swing. When such a pressing member which cannot swing is used, a pressing force, on closing the cover plate 55, will be applied to the BGA type IC package A only on the side near the pivot pin 55a, whereby the BGA type IC package A will be temporarily inclined. So far as the BGA type IC package A is inclined slightly, this inclination will pose no practical problem since the floating plate 61 can also be inclined together with the BGA type IC package A, and when the cover plate 55 is opened and closed, there is no possibility that the contact section 75 of the contact pin 71 comes into contact with the spherical circumferential section 2b.

Second Embodiment

Figure 12:
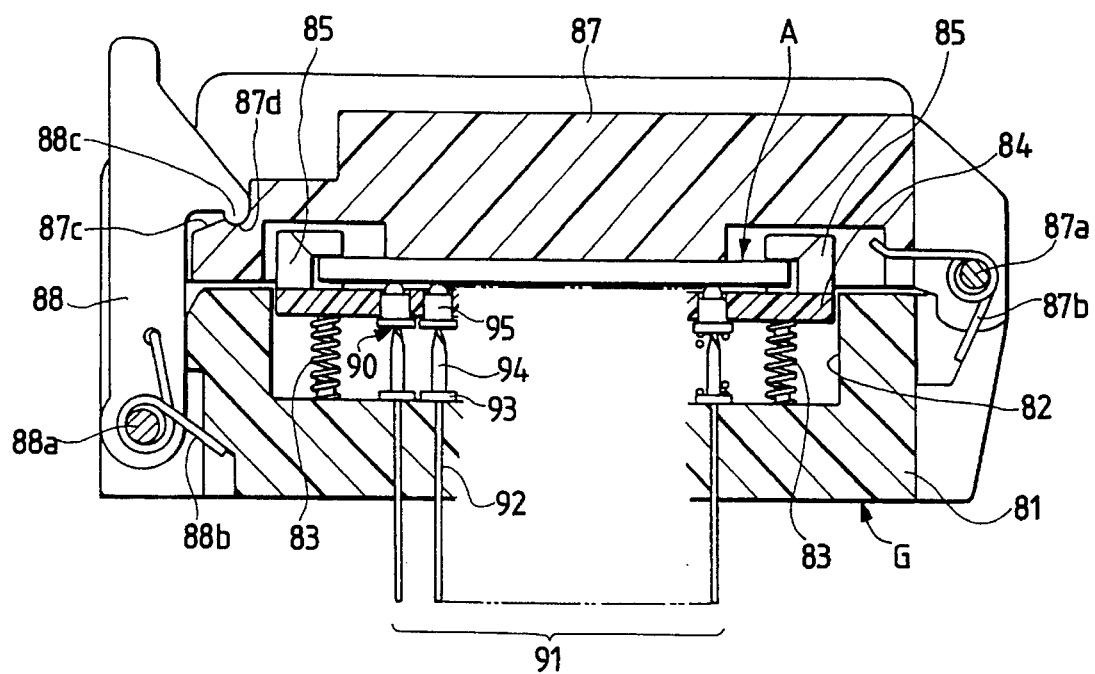
FIG. 12 is a longitudinal sectional front view schematically showing a configuration of an IC socket used in a contact pin device preferred as a second embodiment of the present invention in a condition where the BGA type IC package is mounted on the IC socket.
Figures 13A, 13B:
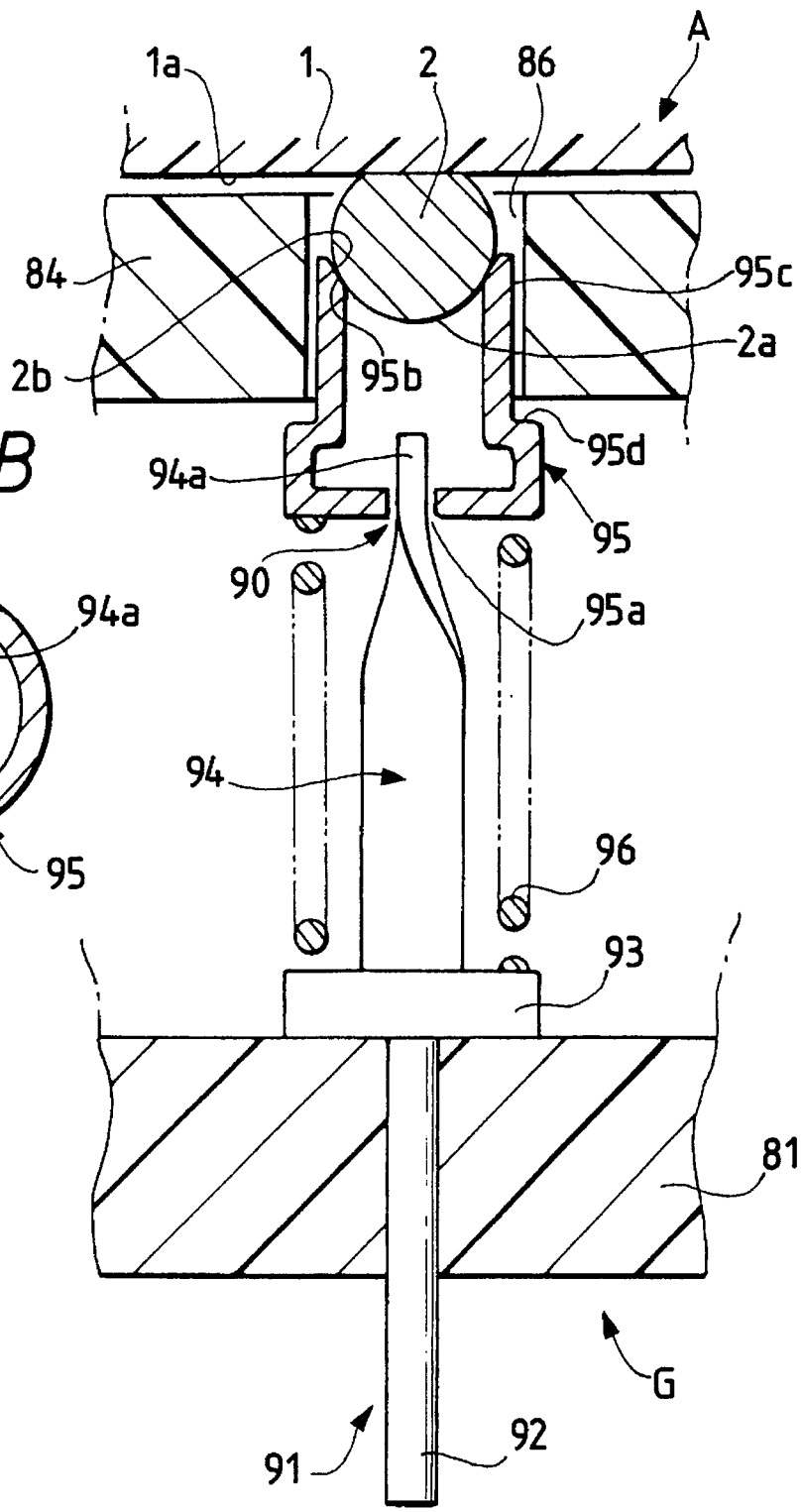
FIGS. 13A and 13B are a partial longitudinal sectional view illustrating, on an enlarged scale, the connection between the connecting terminals of an IC package and the contact pin device in the second embodiment, and a partial cross sectional view of a slidably engaging portion.

In the second embodiment of the present invention illustrated in FIGS. 12, 13A and 13B, the BGA type IC package A, as in the first embodiment, has the package body 1 comprising required circuitry and has the bottom surface 1a on which a large number of protruding solder connecting terminals 2 are arranged in a matrix pattern.

Further, an IC socket G for testing the BGA type IC package A has a concavity 82 formed on a top surface of a socket body 81, and a floating plate 84 which is guided so as to be movable in the vertical direction and always urged upward by a spring 83.

The floating plate 84 are provided with a plurality of protruding positioning pieces 85 for receiving and positioning the package body 1 of the IC package A, as in the case of the IC socket shown in FIGS. 6 to 9. In the plate on which the positioning pieces 85 are disposed at four corners, contact member reception openings 86 are provided at locations corresponding to the connecting terminals 2 of the package body 1, for receiving contact members 95 of a contact pin device 91 which is to be described below.

The contact pin device 91 is composed of takeout terminals 92 fixed at due positions under a base plate and fixing collars 93; twisted lead plates 94 mounted on the fixing collars 93 and having top ends which are twisted at a required lead angle within a predetermined range to form twisted lead pieces 94a for generating a sliding rotating force; contact members 95 having rectangular lead holes 95a which receive the twisted lead pieces 94a of the twisted lead plates 94 in a vertically slidable manner; tapered contact surfaces 95b for receiving the spherical circumferential sections 2b above the spherical tips 2a of the connecting terminals 2 into top inner circumferential surfaces thereof and steps 95d formed on outer circumferences for preventing the contact members 95 from running through the contact member reception openings 86 so that outer circumferences 95c can be inserted into the contact member reception openings 86 and the steps 95d are opposed to the bottom surfaces of the openings 86; and sustaining coil springs 96 which are interposed between the top surfaces of the fixing collars 93 and the bottom surfaces of the contact members 95, and always urge the contact members 95 upward. That is to say, the slidable engagement between the twisted lead pieces 94a and the rectangular lead holes 95a composes a sliding-rotation converter mechanism 90.

Further, the socket body 81 is equipped with a cover plate 87 which is hinged by a pivot pin 87a studded on the right side thereof for allowing the cover plate 87 to be opened and closed as desired and always urged by a spring 87b in an opening direction (toward an open position thereof), and on the left side of the socket body 81, has a latch lever 88 which is hinged by a pivot pin 88a for allowing the latch lever 88 to be raised or fell down as desired and always urged by a spring 88b in a rising direction (toward a latching position thereof). In the front surface of the cover plate 87, a latch groove 87d is formed by way of a slant guide surface 87c, and on the right side section of the latch lever 88, a downward protruding latch jaw 88c in formed which is guided by the slant guide surface 87c to latch the cover plate 87 by the latch groove 87d in a closed condition thereof.

On the IC socket G used in the second embodiment of the present invention for testing the BGA type IC package A, the cover plate 87 is set in an open condition thereof by the spring 87b upon releasing the latch lever 88 from the socket body 81 against the resilience of the spring 88b. When the package body 1 is set among the positioning pieces 85 on the floating plate 84, the package body 1 falls among the positioning pieces 85 and is automatically positioned. Upon pressing the cover plate 87 against the resilience of the spring 87b, the cover plate 87 uniformly presses from upside the package body 1 positioned among the positioning pieces 85, thereby allowing the floating plate 84 to go down against the resilience of the springs 83. In this way, the connecting terminals 2 of the package body 1 are brought into contact with the tapered inner circumferential contact surfaces 95b of the tops of the contact members 95 protruding through the contact member reception openings 86. In a condition where the package body 1 is pressed downward as described above, the latch jaw 88c of the latch lever 88 is engaged with the latch groove 87d of the cover plate 87. Mounting of the BGA type IC package A on the IC socket G is completed by the operations described above.

At the stage in which the connecting terminals 2 of the package body 1 is brought into contact with the contact members 95 of the contact pin device 91, the connecting terminals 2 are wiped by the contact members 95 as described below.

When the connecting terminals 2 further press the contact members 95 in a condition where the connecting terminals 2 are in contact with the tapered inner circumferential surfaces 95b of the contact members 95, the rectangular lead holes 95a of the contact members 95 are guided by the twisted lead pieces 94a of the twisted lead plates 94 to acquire a rotating force corresponding to the lead angle thereof. As a result, the tapered inner circumferential contact surfaces 95b effectively rub the spherical surfaces of the connecting terminals 2 excluding the spherical tips 2a by utilizing the acquired rotating force while the contact surfaces 95b are kept in contact with the spherical circumferential sections 2b of the connecting terminals 2, or effectively perform the wiping action by the required rotation. Accordingly, the breakage of the films of oxide and/or removal of dust are effectively performed for secure electrical connection which is quite free from injury or breakage of the spherical tips 2a of the connecting terminals 2. Then, performance evaluation tests of the BGA type IC package A can be carried out and the IC package restores its original condition upon releasing the pressing force.

It is generally sufficient for obtaining an effective wiping function to select a rubbing range from 0.25 mm to 0.3 mm. In other words, if a rotating rubbing action is performed in the neighborhood of sections having the largest diameters of the connecting terminals 2 in view of the size of the connecting terminals 2 of an ordinary BGA type IC package, it is only necessary to rotate the contact members 95 of the contact pin device 91 at an angle of approximately 40° to 45°.

In the second embodiment of the present invention described above, the twisted lead plates 94 having the twisted lead pieces 94a are used as indirect fixing members for establishing electrical connection to the connecting terminals 2 and the contact members 95 having the rectangular lead holes 95a are adopted as direct movable contact members to constitute the contact pin device 91. However, this aspect is merely shown by way of example, and the similar functions and effects can be obtained by contriving, on the basis of the technological concept of the present invention, so that the fixing and sustaining members will have a structure corresponding to the lead holes, and the movable contacts will have a structure corresponding to the twisted lead pieces. It will be adequate to consider that a mechanism and structures composed by these members are correlated to each other. This consideration applies also to the embodiments of the present invention which are to be described below.

Third Embodiment

In the third embodiment of the present invention shown in FIGS. 14 and 15, the sliding-rotation converter mechanism 90 of the contact pin device 91 is constructed as described below.

The third embodiment adopts, in place of the twisted lead plates 94 having the twisted lead pieces 94a used in the second embodiment, leads levers 97, each of which has sliding cam pins 98 protruding from a required location of the upper circumference thereof. Further, the third embodiment adopts, in place of the contact members 95 having the rectangular lead holes 95a, contact members 99, each of which is slidably fitted over the top end of the lead lever 97 and has a slant cam surface for slidable engagement with the sliding cam pins 98, or a tapered inner circumferential contact surface 99a having a cam groove 100 slanted at a required lead angle. A sustaining coil spring 96 is similarly interposed between the lead lever 97 and the contact member 99.

When the connecting terminals 2 further press the contact members 99 in a condition where the connecting terminals 2 are kept in contact with the tapered inner circumferential contact surfaces 99a of the contact members 99 in the third embodiment having the configuration described above, the slanted cam grooves 100 of the contact members 99 are guided by the sliding cam pins of the lead levers 97 and a required rotating force corresponding to the lead angle is obtained. As a result, the rotating force serves for effectively rubbing the spherical surfaces of the connecting terminals 2 other than the spherical tips 2a to effectuate the wiping function. Accordingly, the breakage of the films of oxide and/or removal of dust are effectively performed for secure electrical connection which is quite free from a fear that the spherical tips 2a of the connecting terminals 2 may be injured or broken. The IC package restores its original condition upon releasing the pressing force.

Fourth Embodiment

Figure 16:
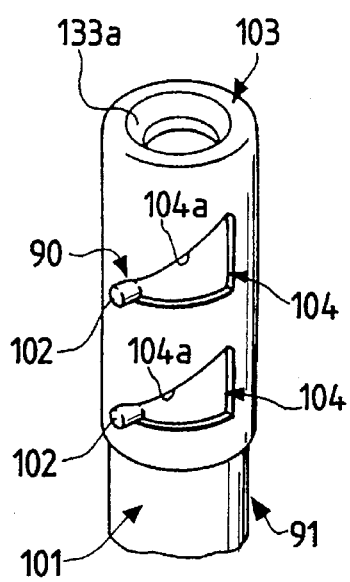
FIG. 16 is a perspective view schematically showing a configuration of a contact pin device preferred as a fourth embodiment of the present invention.
Figure 17:
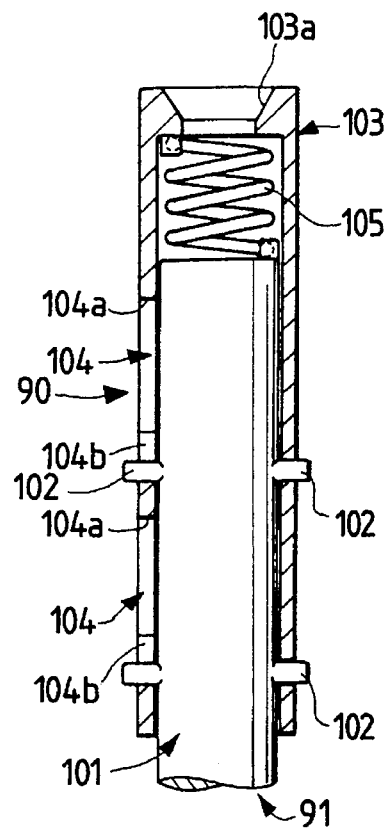
FIG. 17 is a front view illustrating the main members, cut away, of the contact pin device preferred as the fourth embodiment.

In the fourth embodiment shown in FIGS. 16 and 17, the sliding-rotation converter mechanism 90 of the contact pin device 91 is constructed as described below.

The fourth embodiment adopts, in place of the twisted lead plates 94 having the twisted lead pieces 94a used in the second embodiment, lead levers 101, each of which has sliding cam pins 102 protruding from a required location of the upper circumference thereof. Further, the fourth embodiment adopts, in place of the contact members 95 having the rectangular lead holes 95a, contact members 103 each having cams operating to slidably engage the sliding cam pins 102 with the circumference, or operating cams 104 which are formed nearly triangular to have cam surfaces 104a slanted at a required lead angle underside and vertical cam surfaces 104b joined to the slanted cam surfaces 104a. A sustaining coil spring 105 is interposed between the lead lever 101 and the contact member 103.

Figure 18A:
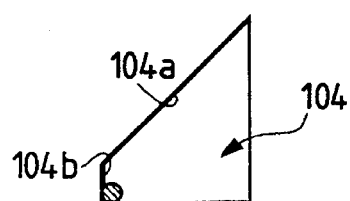
Figure 18B:
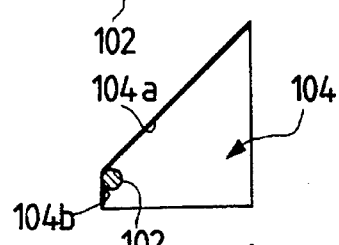
Figure 18C:
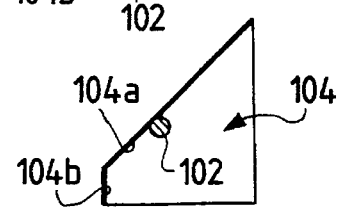
Figure 19A:
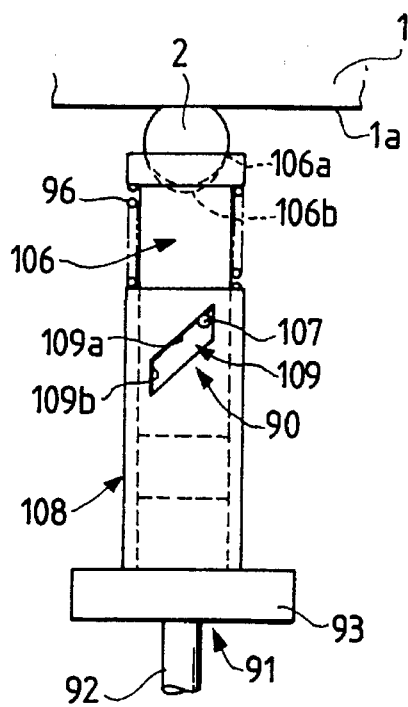
FIGS. 19A, 19B, 19C and 19D are diagrams descriptive of sequential steps of a sliding rotational motion of a contact pin device preferred as a fifth embodiment of the present invention.
Figure 19B:
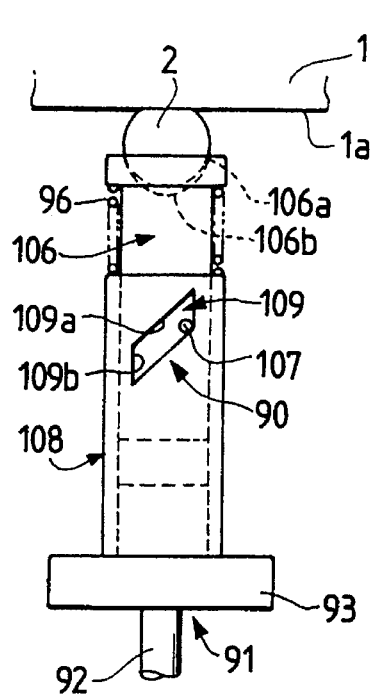
Figure 19C:
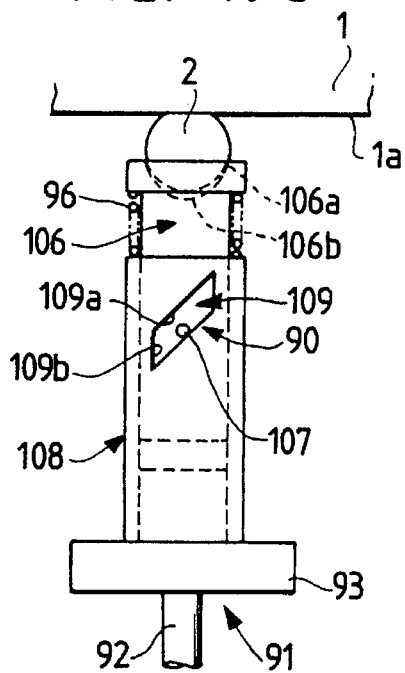
Figure 19D:
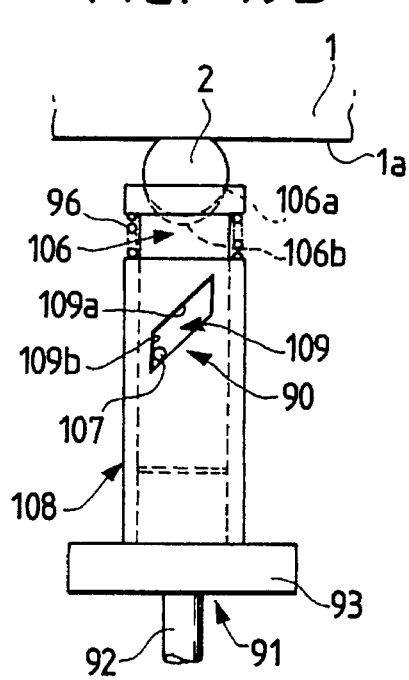

When the connecting terminals 2 further press the contact members 103 in a condition where the connecting terminals 2 are kept in contact with the tapered inner circumferential surfaces 103a in the fourth embodiment having the configuration described above, the pressing force is first exerted along the vertical cam surfaces 104b of the contact members 103 (see FIGS. 18A and 18B), thereby producing a certain degree of contact pressure between the connecting terminals 2 and the contact members 103. Subsequently, the slanted cam surfaces 104a are guided by the sliding cam pins 102 of the lead levers 101 (see FIG. 18C) so that a rotating force corresponding to the lead angle thereof is obtained and the sustaining coil springs 105 are urged twistingly. Accordingly, the breakage of the films of oxide and/or removal of dust are performed by an effective wiping action under relatively strongly pressurized contact between the connecting terminals 2 and the contact members 103. The fourth embodiment assures electrical connection securely and effectively which cannot be established under a relatively weakly pressurized contact.

Fifth Embodiment

In the fifth embodiment of the present invention illustrated in FIGS. 19A through 19D, the sliding-rotation converter mechanism 90 of the contact pin device 91 is configured as described below.

The fifth embodiment has a modified configuration which is obtained by combining the third embodiment with the fourth embodiment. The fifth embodiment adopts sliding cam pins 107 protruding from required locations of an intermediate circumference in combination with rod-like contact members 106 having tapered inner circumferential contact surfaces 106a formed on the top surface thereof to be brought into contact with the spherical circumferential sections 2b of the connecting terminals 2 and concavities 106b which are formed continuously under the tapered inner circumferential contact surfaces 106a and not to be brought into contact with the spherical tips 2a of the connecting terminals 2. Furthermore, the fifth embodiment uses lead levers 108 having operating cams which are formed as hollow pipes capable of receiving the contact members 106 to slide and engage the pins 107 with respect to the upper circumference, or operating cams 109 which are formed in a nearly parallelogramic shape, having cam surfaces 109a at a required lead angle at least on underside and vertical cam surfaces 109b joined to the ends of the slanted cam surfaces 109a. Sustaining coil springs 96 are interposed between the contact members 106 and the lead levers 108.

Accordingly, the fifth embodiment having the configuration described above exhibits functions and effects which can be obtained by combining the third embodiment with the fourth embodiment.

Sixth Embodiment

In the sixth embodiment of the present invention shown in FIG. 20, the contact members 95 in the sliding-rotation converter mechanism 90 of the contact pin device 91 preferred as the second embodiment is replaced with contact members 110 so that the IC socket using the sixth embodiment is applicable to the connecting terminals 24 of the gull-wing type IC package C, as described below.

In the case of the contact members 110 used in the sixth embodiment, the twisted lead pieces 94a of the twisted lead plates 94 are fitted into rectangular lead holes 110a so that these members are engaged with each other for allowing the twisted lead pieces 94a to be freely slidable in the vertical direction, and the top surfaces of the contact members 110 form end contact surfaces 110b which are to be brought into pressurized contact with the bottom contact surfaces 24a of the connecting terminals 24 through the contact member reception openings 35a formed in the floating plate 35 and perform the required rotational rubbing similar to that described above when the IC package C is received in the positioning concavity 36 of the floating plate 35. Further, outer circumferences 110c are provided with steps 110d for preventing the contact members 110 from running through the openings 35a so that the outer circumferences 110c can safely be inserted into the contact member reception openings 35a and the steps 110d are opposed to the lower marginal edges of the openings 35a.

When the IC package C is received into the positioning concavity 36 of the floating plate 35 and the connecting terminals 24 are pressed downward by closing the cover pressing plate 37 in the sixth embodiment having the configuration described above, the contact pin device 91, and therefore the contact members 110, operates as in the case of the second embodiment, whereby the tip contact surfaces 110b of the contact members 110 rotate for rubbing in a condition where they are kept in pressurized contact with the lower contact surfaces 24a of the connecting terminals 24. Accordingly, the sixth embodiment performs the required rubbing operation for breaking the films of oxide and/or removing dust effectively so as to establish secure electrical connection.

Seventh Embodiment

In the case of the seventh embodiment of the present invention shown in FIG. 21, the contact members 95 in the sliding-rotation converter mechanism 90 of the contact pin device 91 preferred as the second embodiment are replaced with contact members 111 so that the IC socket using the second embodiment is applicable to the IC package E having the pad-like connecting terminals 46, as described below.

In the case of the contact members 111 used in the seventh embodiment, the twisted lead pieces 94a of the twisted lead plates 94 are fitted into rectangular lead holes 111a so that these members are engaged with each other for allowing the lead pieces 94a to be freely slidable in the vertical direction, and the top surfaces of the contact members 111 form end contact surfaces 111b which are to be brought into pressurized contact with the bottom contact surfaces 46a of the connecting terminals 46 through the contact member reception openings 15a formed in the floating plate 15 and perform the required rotational rubbing similar to that described above when the IC package E is mounted on the floating plate 15. Further, outer circumferences 111c are provided with steps 111d for preventing the contact members 111 from running through the openings 15a so that the outer circumferences 111c can safely be inserted into the contact member reception openings 15a and the steps 111d are opposed to the lower marginal edges of the openings 15a.

When the IC package E and the connecting terminals 46 are pressed downward by closing the cover pressing plate 18 in the seventh embodiment, the contact members 111 of the contact pin device 91 operate to rotate the end contact surfaces 111b thereof for rubbing in a condition where the contact surfaces 111b are kept in pressurized contact with the lower contact surfaces 46a of the connecting terminals 46. The seventh embodiment is also capable of exhibiting the required wiping effect for establishing secure electrical connection.

As mentioned above, the contact pin device for IC sockets according to the present invention is applicable to IC sockets for IC packages of gull-wing, LGA, and LCC types.

What is claimed is:

1. A contact pin device for IC sockets comprising:

a socket body having a plurality of contact pins;

a floating plate for supporting thereon a ball grid array (BGA) type IC package having a plurality of spherical connecting terminals protruding therefrom, said floating plate being sustained above said socket body so as to be vertically movable, urged upwardly, and having contact receiving sections for receiving said plurality of contact pins;

a pressing member for pressing said floating plate and said BGA type IC package supported thereon downwardly causing said plurality of spherical connecting terminals of said BGA type IC package to be urged against and brought into contact with a plurality of contact members provided at top ends of said plurality of contact pins thus forming electrical connections between said contact pins and said spherical connecting terminals, wherein each of said contact members is formed so as to directly contact a respective spherical connecting terminal only above a bottom portion of said respective spherical connecting terminal; and alignment means disposed on said floating plate for aligning said BGA type IC package with said floating plate, said alignment means including at least one positioning piece disposed so that a clearance between a side of said BGA type IC package and a positioning surface of said positioning piece is smaller than a value obtained by subtracting an allowable deviation range with respect to alignment between said contact receiving sections and said spherical connecting terminals from a difference in size between said contact receiving sections and said spherical connecting terminals.

2. A contact pin device for IC sockets according to claim 1, wherein each of said plurality of contact pins is made of an elastic thin metal sheet having high electrical conductivity, each said elastic thin metal sheet including a contact hole bored in a top end of said elastic thin metal sheet to form said contact member of said contact pin, said contact hole having an inside diameter, at an upper edge thereof, smaller than a diameter of a respective spherical connecting terminal.

3. A contact pin device for IC sockets according to claim 1, wherein each of said plurality of contact pins is made of an elastic thin metal sheet having high electrical conductivity, each said elastic thin metal sheet being formed so that a top end of said elastic thin metal sheet is arranged horizontally to receive a respective spherical connecting terminal and includes a concavity formed therein to act as said contact member of said contact pin, a width of said concavity at upper edges thereof being smaller than a diameter of said respective spherical connecting terminal.

4. A contact pin device for IC sockets according to claim 1, wherein each of said plurality of contact pins is made of an elastic metal wire having high electrical conductivity, each of said elastic metal wires including a horizontal loop formed at a top end of said elastic metal wire to act as said contact member of said contact pin, said loop having an inside diameter smaller than a diameter of a respective spherical connecting terminal.

5. A contact pin device for IC sockets comprising:

a socket body having a plurality of contact pins;

a floating plate for supporting thereon a ball grid array (BGA) type IC package having a plurality of spherical connecting terminals protruding therefrom, said floating plate being sustained above said socket body so as to be vertically movable, urged upwardly, and having contact receiving sections for receiving said plurality of contact pins;

a pressing member for pressing said floating plate and said BGA type IC package supported thereon downwardly causing said plurality of spherical connecting terminals of said BGA type IC package is to be urged against and brought into contact with a plurality of contact members provided at top ends of said plurality of contact pins thus forming electrical connections between said contact pins and said spherical connecting terminals, wherein each said contact members is formed so as to directly contact a respective spherical connecting terminal only above a bottom portion of said respective spherical connecting terminal and to rotate about an axis of said contact member as said respective spherical connecting terminal is urged against said contact member; and alignment means disposed on said floating plate for aligning said BGA type IC package with said floating plate, said alignment means including at least one positioning piece disposed so that a clearance between a side of said BGA type IC package and a positioning surface of said positioning piece is smaller than a value obtained by subtracting an allowable deviation range with respect to alignment between said contact receiving sections and said spherical connecting terminals from a difference in size between said contact receiving sections and said spherical connecting terminals.

6. A contact pin device for IC sockets according to claim 5, wherein each of said contact members is rotated by a sliding-rotation converter mechanism disposed between said contact member and an intermediate member of a corresponding one of said contact pins.

7. A contact pin device for IC sockets according to claim 6, wherein each of said contact members to and urged upwardly by a corresponding intermediate member, and each of said contact members is rotated about said axis by said sliding-rotation converter mechanism as a corresponding spherical connecting terminal contacts said contact member and said floating plate is moved downwardly.

8. A contact pin device for IC sockets according to claim 7, wherein each said sliding-rotation converter mechanism includes at least one coil spring for urging a contact member toward a corresponding spherical connecting terminal.

9. A contact pin device for IC sockets according to claim 6, wherein each of said sliding-rotation converter mechanisms includes a plurality of lead holes formed in one of a corresponding contact member and intermediate member, and twisted lead pieces disposed on the other one of said contact member and said intermediate member to be engaged with said lead holes, and said rotation of said corresponding contact member is caused by sliding between said intermediate member and said contact member as a corresponding spherical connecting terminal contacts said contact member and said floating plate is moved downwardly.

10. A contact pin device for IC sockets according to claim 6, wherein each of said sliding-rotation converter mechanisms is comprised of sliding cam pins disposed on one of a corresponding contact member and intermediate member and slanted cam surfaces formed on the other one of said corresponding contact member and intermediate member, wherein said slanted cam surfaces are slidably engaged with said cam pins.

11. A contact pin device for IC sockets comprising:

a socket body having a plurality of contact pins;

a floating plate for supporting thereon a ball grid array (BGA) type IC package having a plurality of spherical connecting terminals protruding therefrom, said floating plate being sustained above said socket body so as to be vertically movable, urged upwardly, and having contact receiving sections for receiving said plurality of contact pins; and a pressing member for pressing said floating plate and said BGA type IC package supported thereon downwardly causing said plurality of spherical connecting terminals of said BGA type IC package to be urged against and brought into contact with a plurality of contact members provided at top ends of said plurality of contact pins thus forming electrical connections between said contact pins and said spherical connecting terminals, wherein each of said contact members is formed so as to directly contact a respective spherical connecting terminal only above a bottom portion of said respective spherical connecting terminal.

12. A contact pin device for IC sockets comprising:

a socket body having a plurality of contact pins;

a floating plate for supporting thereon a ball grid array (BGA) type IC package having a plurality of spherical connecting terminals protruding therefrom, said floating plate being sustained above said socket body so as to be vertically movable, urged upwardly, and having contact receiving sections for receiving said plurality of contact pins;

a pressing member for pressing said floating plate and said BGA type IC package supported thereon downwardly causing said plurality of spherical connecting terminals of said BGA type IC package to be urged against and brought into contact with a plurality of contact members provided at top ends of said plurality of contact pins thus forming electrical connections between the contact pins and the spherical connecting terminals; and alignment means disposed on said floating plate for aligning said BGA type IC package with said floating plate, said alignment means including at least one positioning piece disposed so that a clearance between a side of said BGA type IC package and a positioning surface of said positioning piece is smaller than a value obtained by subtracting an allowable deviation range with respect to alignment between the contact receiving sections and said spherical connecting terminals from a difference in size between said contact receiving sections and said spherical connecting terminals.

* * * * *